US012610745B2

(12) United States Patent
Sakurai et al.

(10) Patent No.: US 12,610,745 B2
(45) Date of Patent: Apr. 21, 2026

(54) PIEZOELECTRIC DEVICE WITH INSULATING PORTION PROVIDED INSIDE TRENCH

(71) Applicants: DENSO CORPORATION, Kariya-city (JP); TOYOTA JIDOSHA KABUSHIKI KAISHA, Toyota (JP); MIRISE Technologies Corporation, Nisshin (JP); Nisshinbo Micro Devices Inc., Tokyo (JP)

(72) Inventors: Yuya Sakurai, Nisshin-city (JP); Hideo Yamada, Nisshin-city (JP); Megumi Suzuki, Nisshin-city (JP); Tetsuya Enomoto, Nisshin-city (JP); Akihiko Teshigahara, Nisshin-city (JP); Takahide Usui, Fujimino-city (JP); Naokatsu Ikegami, Fujimino-city (JP); Shuji Katakami, Fujimino-city (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP); Nisshinbo Micro Devices Inc., Tokyo (JP)

( * ) Notice: Subject to any disclaimer, the term of this patent is extended or adjusted under 35 U.S.C. 154(b) by 849 days.

(21) Appl. No.: 17/972,673

(22) Filed: Oct. 25, 2022

(65) Prior Publication Data

US 2023/0210012 A1     Jun. 29, 2023

(30) Foreign Application Priority Data

Dec. 28, 2021     (JP) ................................. 2021-214370

(51) Int. Cl.
*H01L 41/18*          (2006.01)
*H01L 41/047*        (2006.01)
         (Continued)

(52) U.S. Cl.
CPC ............. *H10N 30/85* (2023.02); *H10N 30/01* (2023.02); *H10N 30/704* (2024.05); *H10N 30/877* (2023.02)

(58) Field of Classification Search
CPC ...... H10N 30/01; H10N 30/85; H10N 30/877; H10N 30/704
         (Continued)

(56) References Cited

U.S. PATENT DOCUMENTS

| | | |
|---|---|---|
| 7,109,826 B2 | 9/2006 | Ginsburg et al. |
| 2004/0135850 A1 | 7/2004 | Kim |

(Continued)

FOREIGN PATENT DOCUMENTS

| | | |
|---|---|---|
| JP | H08-256398 A | 10/1996 |
| JP | 2009-126021 A | 6/2009 |
| JP | 2014-058082 A | 4/2014 |

*Primary Examiner* — Emily P Pham
*Assistant Examiner* — Monica Mata
(74) *Attorney, Agent, or Firm* — Posz Law Group, PLC

(57) ABSTRACT

A piezoelectric device includes a base member, a first conductive film arranged above the base member in contact with an upper surface of the base member, a piezoelectric film arranged above the first conductive film in contact with an upper surface of the first conductive film, a second conductive film arranged on the piezoelectric film, and an insulating portion provided inside a trench penetrating through the piezoelectric film and the first conductive film. The insulating portion has a higher electrical resistivity than the piezoelectric film.

14 Claims, 9 Drawing Sheets

(51) Int. Cl.
| | |
|---|---|
| *H01L 41/08* | (2006.01) |
| *H01L 41/22* | (2013.01) |
| *H10N 30/00* | (2023.01) |
| *H10N 30/01* | (2023.01) |
| *H10N 30/85* | (2023.01) |
| *H10N 30/87* | (2023.01) |

(58) Field of Classification Search
USPC .......................................................... 310/311
See application file for complete search history.

(56)                    References Cited

U.S. PATENT DOCUMENTS

| | | | |
|---|---|---|---|
| 2005/0146772 A1 | 7/2005 | Murata et al. |
| 2005/0210988 A1 | 9/2005 | Amano et al. |
| 2005/0248232 A1 | 11/2005 | Itaya et al. |
| 2008/0024563 A1 | 1/2008 | Matsui et al. |
| 2012/0056946 A1 | 3/2012 | Kojima et al. |
| 2022/0232328 A1 | 7/2022 | Mawatari et al. |

PIEZOELECTRIC DEVICE WITH INSULATING PORTION PROVIDED INSIDE TRENCH

CROSS REFERENCE TO RELATED APPLICATION

The present application is based on and claims the benefit of priority of Japanese Patent Application No. 2021-214370, filed on Dec. 28, 2021, the disclosure of which is incorporated herein by reference.

TECHNICAL FIELD

The present disclosure generally relates to a piezoelectric device.

BACKGROUND

A piezoelectric device includes a base member, a first conductive film arranged on the base member, a piezoelectric film arranged on the first conductive film, and a second conductive film arranged on the piezoelectric film.

SUMMARY

According to an aspect of the present disclosure, a piezoelectric device may include a base member, a first conductive film arranged on the base member in contact with an upper surface of the base member and made of a conductive material, a piezoelectric film arranged on the first conductive film in contact with the upper surface of the first conductive film and made of a piezoelectric material, and a second conductive film arranged on the piezoelectric film and made of a conductive material. An insulating portion having a higher electrical resistivity than the piezoelectric film is provided inside a trench that penetrates through the piezoelectric film and the first conductive film.

BRIEF DESCRIPTION OF THE DRAWINGS

Objects, features, and advantages of the present disclosure will become more apparent from the following detailed description made with reference to the accompanying drawings, in which:

FIG. 5E is a cross-sectional view showing a manufacturing process of the piezoelectric device following FIG. 5D;

DETAILED DESCRIPTION

Figure 1:
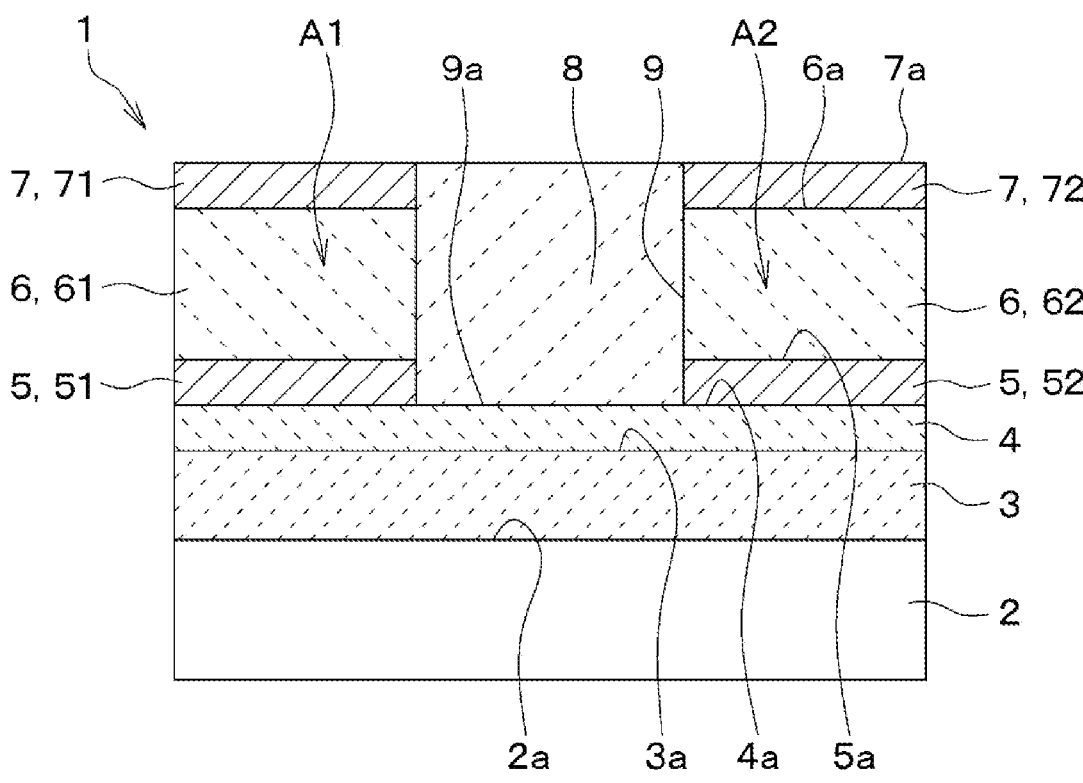
FIG. 1 is a cross-sectional view of a piezoelectric device of a first embodiment.

A piezoelectric device may include a base member, two first conductive films arranged on the base member, a piezoelectric film arranged on the first conductive films, and two second conductive films arranged on the piezoelectric film.

In the piezoelectric device, the two first conductive films are arranged on an upper surface of the base member with a gap disposed therebetween. The piezoelectric film is continuously arranged in contact with the upper surface of the two first conductive films and the upper surface of a portion of the base member positioned between the two first conductive films. The two second conductive films are arranged above the piezoelectric film, with a gap disposed therebetween. When manufacturing the piezoelectric device having such a structure, one piezoelectric film continuously extends over the upper surfaces of different materials.

In such case, the film formation of the piezoelectric film is disturbed at a joint portion of the different materials, in a portion where the piezoelectric layers are formed at a joint portion of different materials. Therefore, in the portion of the piezoelectric film positioned between the two first conductive films, crystallinity of the piezoelectric material deteriorates or cracks occur. The piezoelectric element is provided with (i) one laminated portion in which one first conductive film, the piezoelectric film and one second conductive film are laminated, and (ii) the other laminated portion in which the other first conductive film, the piezoelectric film and the other second conductive film are laminated. Thus, when the piezoelectric element is used, a leak current may generate between the first conductive film and the second conductive film of each of the laminated portions, or a leak current may be generated between the two first conductive films.

Such a matter occurs not only when the piezoelectric device includes one layer of piezoelectric film, but also when the piezoelectric device includes a plurality of piezoelectric films. That is, such a matter is caused when a piezoelectric film is arranged at a position (e.g., a gap) between the two conductive films, in a piezoelectric device in which (i) two conductive films are arranged with a gap interposed therebetween and (ii) a piezoelectric film is arranged on each of the two conductive films.

It is an object of the present disclosure to provide a layered structure of a piezoelectric device capable of avoiding a leak current.

According to a first exemplar of the present disclosure, a piezoelectric device includes a base member, a first conductive film arranged on the base member in contact with an upper surface of the base member and is made of a conductive material, a piezoelectric film arranged on the first conductive film in contact with an upper surface of the first conductive film and made of a piezoelectric material, a second conductive film arranged on the piezoelectric film and made of a conductive material, and an insulating portion provided inside a trench that penetrates through the piezoelectric film and the first conductive film. The insulating portion has an electrical resistivity higher than that of the piezoelectric film.

According to the above, the insulating property can be secured by the insulating portion, between (i) the first conductive film and the piezoelectric film which are layered on one side of the insulating portion and (ii) the first conductive film and the piezoelectric film which are layered on the other side of the insulating portion. That is, no piezoelectric film is arranged in a gap between the two first conductive films. In such manner, the piezoelectric device of the exemplar of the present disclosure can prevent a leak of an electric current from being generated, because the piezoelectric film is not positioned between the two first conductive films.

According to another exemplar of the present disclosure, a piezoelectric device includes a base member; a first conductive film arranged on the base member in contact with an upper surface of the base member and made of a conductive material; a first piezoelectric film arranged on the first conductive film in contact with an upper surface of the first conductive film, and made of a piezoelectric material; a second conductive film arranged on the first piezoelectric film and made of a conductive material; a second piezoelectric film arranged on the second conductive film in contact with an upper surface of the second conductive film and made of a piezoelectric material; a third conductive film arranged on the second piezoelectric film and made of a conductive material; and an insulating portion provided inside a trench that penetrates through at least the second piezoelectric film and the second conductive film. The insulating portion has an electrical resistivity higher than that of the second piezoelectric film.

According to the above, the insulating property, between (i) the second conductive film and the second piezoelectric film layered on one side of the insulating portion and (ii) the second conductive film and the second piezoelectric film layered on the other side of the insulating portion, can be secured by the insulating portion. That is, no second piezoelectric film is arranged in a gap between the two second conductive films. Thus, in the layered structure of the piezoelectric device, it can prevent a leak of an electric current.

The insulating portion may be a first insulating portion disposed in a first trench as the trench that penetrates through the second piezoelectric film and the second conductive film without penetrating through the first piezoelectric film. A second insulating portion may be disposed inside a second trench at a position away from the first trench in a planar direction along an upper surface of the first piezoelectric film. In this case, the second trench penetrates through the first piezoelectric film and the first conductive film, without penetrating through the second conductive film.

Alternatively, the insulating portion may a first insulating portion disposed in a first trench as the trench that penetrates through the second piezoelectric film and the second conductive film without penetrating through the first piezoelectric film. In this case, a second insulating portion may be disposed inside a second trench at a position away from the first trench in a planar direction along an upper surface of the first piezoelectric film, and the second trench penetrates through the first piezoelectric film and the first conductive film without penetrating through the second conductive film. Furthermore, a third insulating portion may be further disposed inside a third trench at a position away from each of the first trench and the second trench in a planar direction along the upper surface of the first piezoelectric film. The third trench penetrates through all the second piezoelectric film, the second conductive film, the first piezoelectric film and the first conductive film.

Hereinafter, embodiments of the present disclosure will be described with reference to the drawings. In the following embodiments, the same reference numerals are assigned to components/configurations that are the same or equivalent to each other for description.

First Embodiment

A piezoelectric device 1 of the present embodiment shown in FIG. 1 is applied to a sensor, an actuator, or the like. The piezoelectric device 1 includes a substrate 2, an insulating film 3, a seed film 4, a first conductive film 5, a piezoelectric film 6, a second conductive film 7, and an insulating portion 8.

The substrate 2 is made of silicon (that is, Si) or the like. The insulating film 3 is arranged on the substrate 2 in contact with an upper surface 2a of the substrate 2. The insulating film 3 is a film, or a membrane, made of an insulating material. Examples of the insulating material constituting the insulating film 3 include silicon oxide (that is, SiO2) and the like.

The seed film 4 is arranged on the insulating film 3 in contact with an upper surface 3a of the insulating film 3. The seed film 4 is used for improving the orientation (that is, crystallinity) of the materials constituting the first conductive film 5 and the piezoelectric film 6 formed on the seed film 4.

The first conductive film 5 is a film, or a membrane, made of a conductive material. The first conductive film 5 is in contact with an upper surface 4a of the seed film 4 and is arranged on the seed film 4. Therefore, in the present embodiment, the seed film 4 is a base of the first conductive film 5.

The piezoelectric film 6 is in contact with an upper surface 5a of the first conductive film 5 and is arranged on the first conductive film 5. The piezoelectric film 6 is a film, or a membrane, made of a piezoelectric material. In the present embodiment, aluminum nitride scandium (that is, ScAlN) is used as the piezoelectric material. Aluminum nitride (that is, AlN) is used as a material constituting the seed film 4. As the piezoelectric material, other piezoelectric materials such as AlN and lead zirconate titanate (that is, PZT) or the like may also be used. When AlN is used as the piezoelectric material, AlN is used as the material constituting the seed film 4.

The second conductive film 7 is in contact with an upper surface 6a of the piezoelectric film 6 and is arranged on the piezoelectric film 6. The second conductive film 7 is a film, or a membrane, made of a conductive material. As the conductive material constituting each of the first conductive film 5 and the second conductive film 7, a metal material containing any one of molybdenum, titanium, platinum, aluminum, ruthenium and the like as a main component is used. As the conductive material, a material other than the metal material may be used. The conductive material constituting the second conductive film 7 may be the same as the conductive material constituting the first conductive film 5, but may be different.

The insulating portion 8 is provided inside a trench 9 penetrating the second conductive film 7, the piezoelectric film 6 and the first conductive film 5 from an upper surface 7a of the second conductive film 7. A bottom portion 9a of the trench 9 is positioned on the seed film 4. The insulating portion 8 has a higher electrical resistivity than the piezo-electric film 6. The electrical resistivity is the volume resistivity. The electrical resistivity of the insulating portion 8 is $10^8$ Ω·m or more. The insulating portion 8 is made of an insulating material embedded inside the trench 9. The insu-lating material is embedded in the trench 9 from the bottom portion 9a thereof up to the same position as the upper surface 7a of the second conductive film 7. Examples of the insulating material constituting the insulating portion 8 include SiO2, silicon nitride (that is, SiN) and the like.

In the piezoelectric device 1 of the present embodiment, a laminated portion A1 on one side, which is made by laminating (i) a first conductive film 51 on one side of the insulating portion 8 in the entire first conductive film 5, (ii) a piezoelectric film 61 on one side of the insulating portion 8 in the entire piezoelectric film 6, and (iii) a second conductive film 71 on one side of the insulating portion 8 in the entire second conductive film 7, can be used as a piezoelectric element. When the laminated portion A1 on the one side is used as a piezoelectric element, the first conduc-tive film 51 on one side is used as a lower electrode, and the second conductive film 71 on one side is used as an upper electrode.

Further, a laminated portion A2 is made by laminating (i) a first conductive film 52 on the other side of the insulating portion 8 in the entire first conductive film 5, (ii) a piezo-electric film 62 on the other side of the insulating portion 8 in the entire piezoelectric film 6, and (iii) a second conduc-tive film 72 on the other side of the insulating portion 8 in the entire second conductive film 7 can be used as a piezoelectric element. The other side of the insulating por-tion 8 is an opposite side of the one side of the insulating portion 8. When the laminated portion A2 on the other side is used as a piezoelectric element, the first conductive film 52 on the other side is used as a lower electrode, and second conductive film 72 on the other side is used as an upper electrode.

The first conductive film 51 on one side and the first conductive film 52 on the other side are separated from each other, and are insulated by the insulating portion 8 posi-tioned between the two first conductive films 51, 52. The second conductive film 71 on one side and the second conductive film 72 on the other side are separated from each other, and are insulated by the insulating portion 8 posi-tioned between the two second conductive films 71, 72.

Depending on how the laminated portion A1 on the one side and the laminated portion A2 on the other side are used, the second conductive film 71 on one side and the second conductive film 72 on the other side may be electrically connected by a wiring portion (not shown). Further, one of the laminated portion A1 on the one side and the laminated portion A2 on the other side may be used as a piezoelectric element, and the other of the laminated portion A1 on the one side and the laminated portion A2 on the other side may be not used as a piezoelectric element.

Next, a method of manufacturing the piezoelectric device 1 of the present embodiment is described.

Figure 2A:
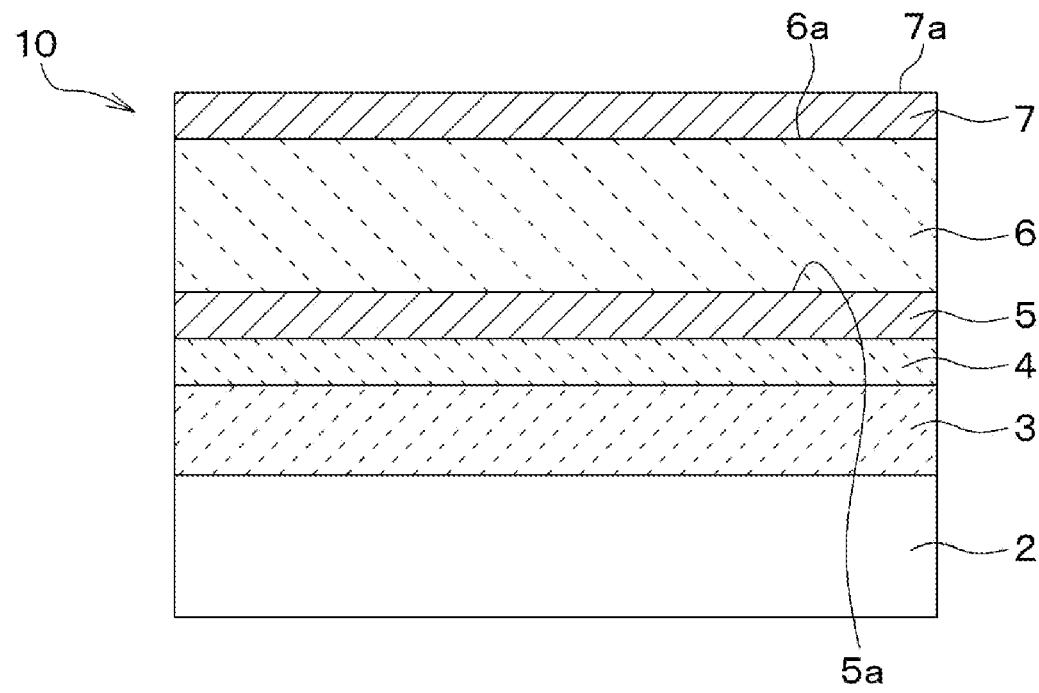
FIG. 2A is a cross-sectional view showing a manufacturing process of the piezoelectric device of the first embodiment.

First, as shown in FIG. 2A, a laminated body 10 is formed in which the substrate 2, the insulating film 3, the seed film 4, the first conductive film 5, the piezoelectric film 6, and the second conductive film 7 are laminated. In forming the laminated body 10, the insulating film 3, the seed film 4, and the first conductive film 5 are formed on the substrate 2 in the order described. After that, the piezoelectric film 6 is formed on the first conductive film 5 in contact with the upper surface 5a of the first conductive film 5. After that, the second conductive film 7 is formed on the piezoelectric film 6 in contact with the upper surface 6a of the piezoelectric film 6.

Figure 2B:
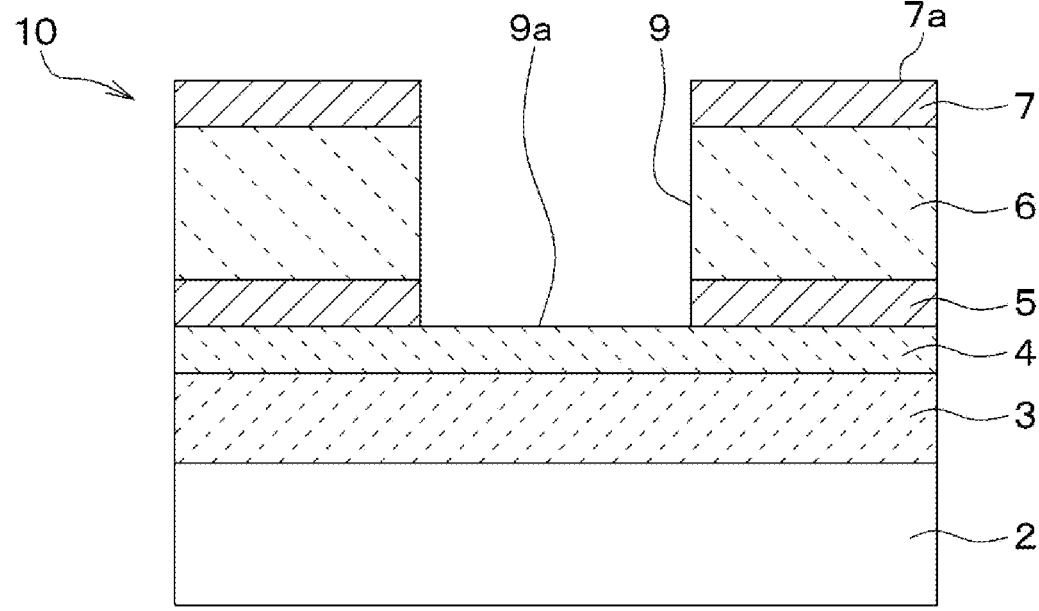
FIG. 2B is a cross-sectional view showing a manufacturing process of the piezoelectric device following FIG. 2A.

Subsequently, as shown in FIG. 2B, the trench 9 is formed from the upper surface 7a of the second conductive film 7 to penetrate through the second conductive film 7, the piezo-electric film 6, and the first conductive film 5. The bottom portion 9a of the trench 9 is positioned on the seed film 4. The trench 9 is formed by photolithography and etching. As the etching method, a method corresponding to the material constituting each of the second conductive film 7, the piezoelectric film 6 and the first conductive film 5 is adopted.

Figure 2C:
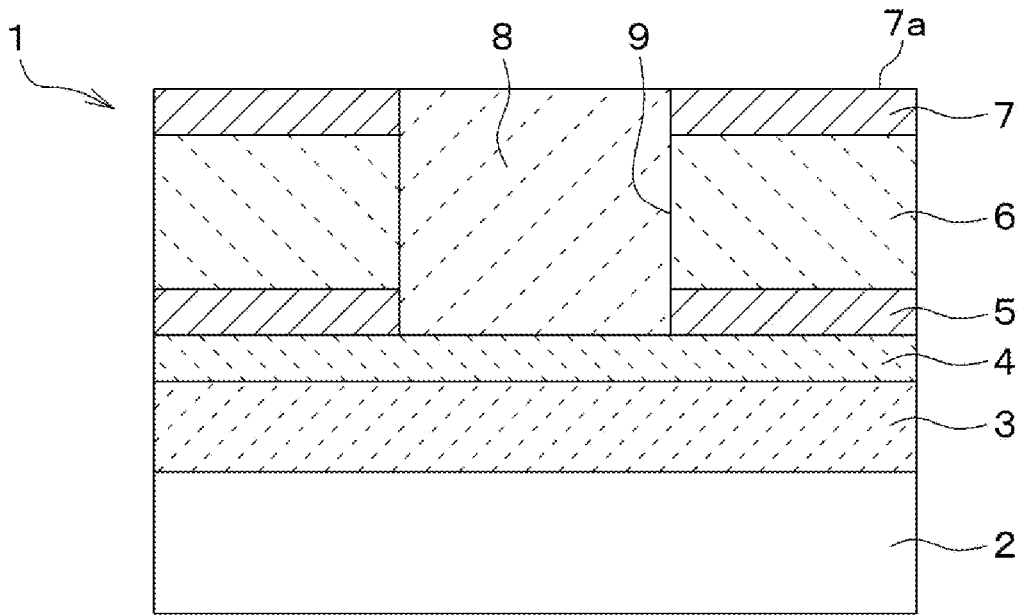
FIG. 2C is a cross-sectional view showing a manufacturing process of the piezoelectric device following FIG. 2B.

Subsequently, as shown in FIG. 2C, the insulating portion 8 is formed by embedding an insulating material inside the trench 9. In such manner, the piezoelectric device 1 of the present embodiment is manufactured.

Figure 3:
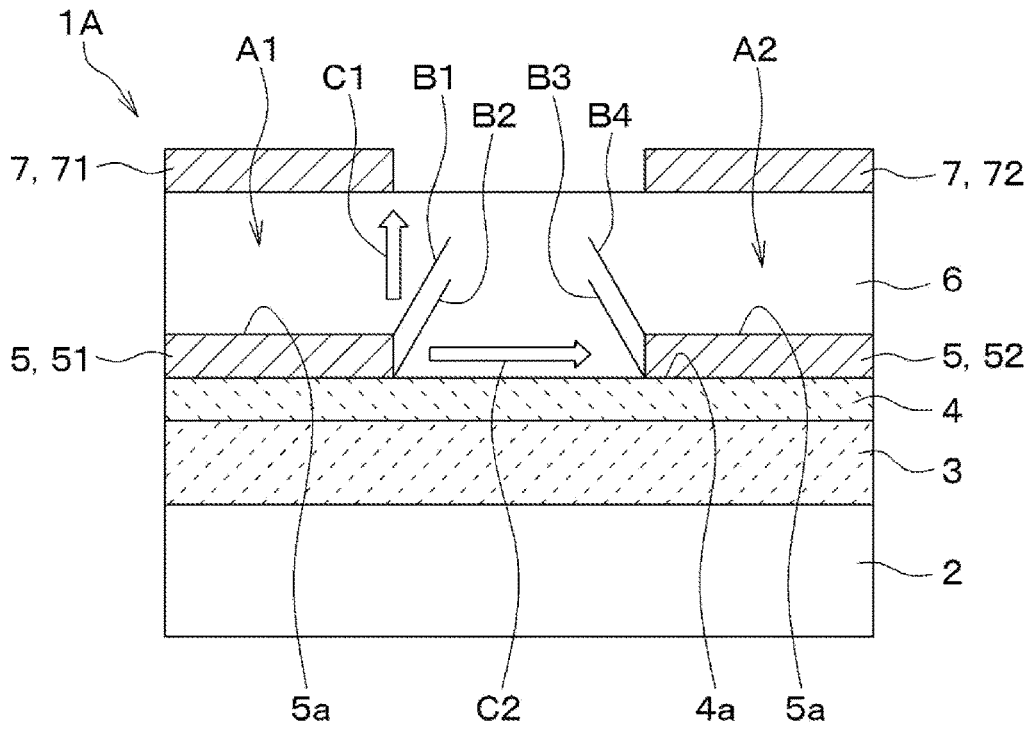
FIG. 3 is a cross-sectional view of the piezoelectric device of a comparative example 1.

The effects of the present embodiment are described in comparison with a piezoelectric device 1A of a comparative example 1 shown in FIG. 3. The piezoelectric device 1A of the comparative example 1 does not include the insulating portion 8 of the present embodiment. In the piezoelectric device 1A of the comparative example 1, the two first conductive films 51 and 52 are arranged on the seed film 4 with a gap from each other. The piezoelectric film 6 is continuously arranged on the two first conductive films 51 and 52 and in a portion between the two first conductive films 51 and 52.

In the method for manufacturing the piezoelectric device 1A of the comparative example 1, the two first conductive films 51 and 52 are formed on the seed film 4 with a gap interposed therebetween. After that, one piezoelectric film 6 is formed to continuously extend the upper surface 5a of the two first conductive films 51 and 52 and the upper surface 4a of the portion of the seed film 4 positioned between the two first conductive films 51 and 52. In such manner, one continuous piezoelectric film 6 is formed to extend over the upper surfaces of different materials.

In such case, the film formation of the piezoelectric film 6 is disturbed at the joint portion of different materials, a portion where the piezoelectric layers are stepped and joined, and the like. Therefore, in the portion of the piezo-electric film 6 positioned between the two first conductive films 51 and 52, crystallinity of the piezoelectric material deteriorates, or cracks B1, B2, B3 and B4 may occur. As a result, when using, as a piezoelectric element, both of (i) one laminated portion A1 in which one first conductive film 51, the piezoelectric film 6 and one second conductive film 71 are laminated, and (ii) the other laminated portion A2 in which the other first conductive film 52, the piezoelectric film 6, and the other second conductive film 72 are lami-nated, a leak current C1 from the first conductive films 51 and 52 to the second conductive films 71 and 72 occurs. Alternatively, a leak current C2 occurs between the two first conductive films 51 and 52.

In contrast, the piezoelectric device 1 of the present embodiment includes the seed film 4, the first conductive film 5, the piezoelectric film 6, the second conductive film 7, and the insulating portion 8. The piezoelectric film 6 is arranged on the first conductive film 5 in contact with the upper surface 5a of the first conductive film 5. The insulating portion 8 is provided inside the trench 9 penetrating the piezoelectric film 6 and the first conductive film 5, and has a higher electrical resistivity than the piezoelectric film 6.

In the piezoelectric device 1 of the present embodiment, the first conductive film 5, the piezoelectric film 6 and the second conductive film 7 positioned on one side of the insulating portion 8 constitute the laminated portion A1 on one side in which the conductive film and the piezoelectric film are laminated. The first conductive film 5, the piezoelectric film 6 and the second conductive film 7 positioned on the other side of the insulating portion 8 constitute the laminated portion A2 on the other side in which the conductive film and the piezoelectric film are laminated. The insulating portion 8 ensures the insulating property between (i) the first conductive film 5 and the piezoelectric film 6 of the laminated portion A1 on one side and (ii) the first conductive film 5 and the piezoelectric film 6 of the laminated portion A2 on the other side. That is, the piezoelectric film 6 is not arranged at a position between the two first conductive films 5. Therefore, it is possible to avoid the leak current that occurs in the piezoelectric device 1A of the comparative example 1.

Further, the piezoelectric film 6 is formed in contact with only the upper surface 5a of the first conductive film 5, among the upper surface 4a of the seed film 4 and the upper surface 5a of the first conductive film 5. When forming the piezoelectric film 6, the piezoelectric film 6 is formed in contact with only an upper surface of one kind of material. Therefore, a sufficient crystallinity of the piezoelectric material constituting the piezoelectric film 6 can be ensured.

The manufacturing method of the piezoelectric device 1 of the present embodiment may be changed as follows. In preparing the laminated body 10, the laminated body 10 having no second conductive film 7 may be prepared. In forming the trench 9, the trench 9 penetrating the piezoelectric film 6 and the first conductive film 5 may be formed from the upper surface 6a of the piezoelectric film 6. Then, the insulating portion 8 is formed by embedding the insulating material inside the trench 9. After that, the second conductive film 7 may be formed on the upper surfaces of the piezoelectric film 6 and of the insulating portion 8. The second conductive film 7 may be patterned.

Further, the manufacturing method of the piezoelectric device 1 of the present embodiment may be also changed as follows. In forming the trench 9, the trench 9 may be formed to penetrate through the second conductive film 7, the piezoelectric film 6, the first conductive film 5, and the seed film 4, to have the bottom portion 9a of the trench 9 positioned on the insulating film 3. After that, the insulating material is embedded in the trench 9 to form the insulating portion 8. As a result, the seed film 4 is divided into a seed film 4 on one side positioned on one side of the insulating portion 8 and a seed film 4 on the other side positioned on the other side of the insulating portion 8.

Further, in the piezoelectric device 1 of the present embodiment, the insulating portion 8 is made of an insulating material embedded inside the trench 9. However, the insulating portion 8 may be made of the air existing inside the trench 9, that is, may be provided as a space portion. The electrical resistivity of air is $1.3 \times 10^{16}$ to $3.3 \times 10^{16}$ $\Omega \cdot m$ or more at 20° C.

Further, the piezoelectric device 1 of the present embodiment includes the seed film 4. However, the piezoelectric device 1 does not have to include the seed film 4. In such case, the first conductive film 5 is in contact with the upper surface 3a of the insulating film 3 and is arranged on the insulating film 3. The insulating film 3 is the base member of the first conductive film 5.

Second Embodiment

Figure 4:
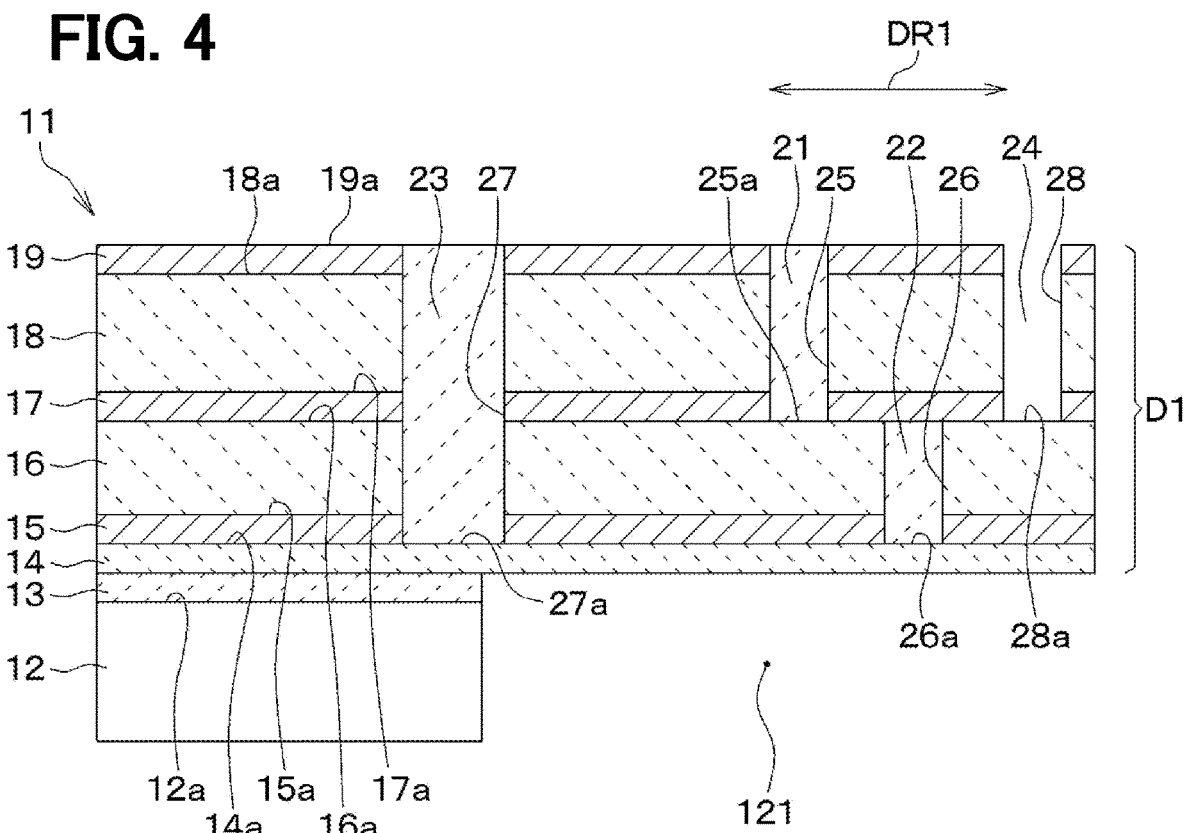
FIG. 4 is a cross-sectional view of a piezoelectric device of a second embodiment.

A piezoelectric device 11 of the present embodiment shown in FIG. 4 is applied to a bimorph type sensor.

Examples of such a sensor include a high-sensitivity sensor such as a piezoelectric microphone or the like. The piezoelectric device 11 includes a substrate 12, an insulating film 13, and a laminated structure portion D1.

The substrate 12 has a space portion 121. The substrate 12 is made of the same material as the substrate 2 of the first embodiment. The insulating film 13 is arranged on the substrate 12 in contact with an upper surface 12a of the substrate 12. The insulating film 13 is made of the same material as the insulating film 3 of the first embodiment.

The laminated structure portion D1 is arranged to extend to both the insulating film 13 and the space portion 121. A portion of the laminated structure portion D1 positioned above the space portion 121 is floating and can vibrate. The part portion of the laminated structure portion D1 positioned above the space portion 121 is a sensing part. A portion of the laminated structure portion D1 positioned above the insulating film 13 and the substrate 12 is supported by the insulating film 13 and the substrate 12. As described above, the laminated structure portion D1 is in a cantilevered state.

In the laminated structure portion D1, the piezoelectric film and the conductive film are laminated. Specifically, the laminated structure portion D1 is a body in which a seed film 14, a first conductive film 15, a first piezoelectric film 16, a second conductive film 17, a second piezoelectric film 18, and a third conductive film 19 are laminated in the order described.

The seed film 14 is used to improve the crystallinity of the materials constituting the first conductive film 15 and the first piezoelectric film 16. The seed film 14 is made of the same material as the seed film 4 of the first embodiment. The seed film 14 is a base for the first conductive film 15. The first conductive film 15 is in contact with an upper surface 14a of the seed film 14 and is arranged on the seed film 14. The first conductive film 15 is a film, or a membrane, made of a conductive material. The first piezoelectric film 16 is in contact with an upper surface 15a of the first conductive film 15 and is arranged on the first conductive film 15. The first piezoelectric film 16 is a film, or a membrane, made of a piezoelectric material.

The second conductive film 17 is arranged on the first piezoelectric film 16 in contact with an upper surface 16a of the first piezoelectric film 16. The second conductive film 17 is a film, or a membrane, made of a conductive material. The second piezoelectric film 18 is in contact with an upper surface 17a of the second conductive film 17 and is arranged on the second conductive film 17. The second piezoelectric film 18 is a film, or a membrane, made of a piezoelectric material. The third conductive film 19 is arranged on the second piezoelectric film 18 in contact with an upper surface 18a of the second piezoelectric film 18. The third conductive film 19 is a film, or a membrane, made of a conductive material.

A portion of the laminated structure portion D1 in which the first conductive film 15, the first piezoelectric film 16, the second conductive film 17, the second piezoelectric film 18, and the third conductive film 19 are laminated can be used as a piezoelectric element. When such a portion is used as a piezoelectric element, the first conductive film 15 is used as a lower electrode, the second conductive film 17 is used as an intermediate electrode, and the third conductive film 19 is used as an upper electrode.

The conductive material constituting each of the first conductive film 15, the second conductive film 17 and the third conductive film 19 is same as the conductive material constituting each of the first conductive film 5 and the second conductive film 7 of the first embodiment. The material constituting the first conductive film 15, the material constituting the second conductive film 17, and the material constituting the third conductive film 19 are the same, but may be different.

The piezoelectric material constituting each of the first piezoelectric film 16 and the second piezoelectric film 18 is the same as the piezoelectric material constituting the piezoelectric film 6 of the first embodiment. In the present embodiment, the material constituting the first piezoelectric film 16 and the material constituting the second piezoelectric film 18 are the same, but may be different.

The laminated structure portion D1 has a first insulating portion 21, a second insulating portion 22, a third insulating portion 23, and a fourth insulating portion 24.

The first insulating portion 21 is provided inside a first trench 25. The first trench 25 penetrates through the third conductive film 19, the second piezoelectric film 18 and the second conductive film 17 from the upper surface 16a of the second piezoelectric film 18. A bottom portion 25a of the first trench 25 is positioned on an upper surface of the first piezoelectric film 16. The first insulating portion 21 has a higher electrical resistivity than the second piezoelectric film 18. The first insulating portion 21 is made of an insulating material embedded inside the first trench 25. The insulating material is embedded in the trench 25 from the bottom 25a of the trench 25 up to the same position as an upper surface 19a of the third conductive film 19.

The second insulating portion 22 is provided inside a second trench 26. The second trench 26 penetrates through the first piezoelectric film 16 and the first conductive film 15 from the upper surface 16a of the first piezoelectric film 16 at a position separated from the first trench 25 in a planar direction DR1 of the laminated structure portion D1. The planar direction DR1 is a direction along the upper surface 16a of the first piezoelectric film 16. The bottom portion 26a of the second trench 26 is positioned on the seed film 14. The second trench 26 does not penetrate through the third conductive film 19, the second piezoelectric film 18, and the second conductive film 17. The second insulating portion 22 has a higher electrical resistivity than the first piezoelectric film 16. The second insulating portion 22 is made of an insulating material embedded inside the second trench 26. The insulating material is embedded in the second trench 26 from a bottom portion 26a of the second trench 26 up to the same position as the upper surface 16a of the first piezoelectric film 16.

The third insulating portion 23 is provided inside a third trench 27. The third trench 27 is disposed at a position separated from each of the first trench 25 and the second trench 26 in the planar direction DR1, and penetrates through the third conductive film 19, the second piezoelectric film 18, the second conductive film 17, the first piezoelectric film 16 and the first conductive film 15 from the upper surface 19a of the third conductive film 19. A bottom portion 27a of the third trench 27 is positioned on the seed film 14. The third insulating portion 23 has a higher electrical resistivity than the second piezoelectric film 18 and the first piezoelectric film 16. The third insulating portion 23 is made of an insulating material embedded inside the third trench 27. The insulating material is embedded in the third trench 27 from the bottom portion 27a of the third trench 27 up to the same position as the upper surface 19a of the third conductive film 19.

The insulating materials constituting each of the first insulating portion 21, the second insulating portion 22, and the third insulating portion 23 are SiO2, SiN, or the like. The same insulating material is used as the insulating material constituting each of the first insulating portion 21, the second insulating portion 22, and the third insulating portion 23, but different materials may be used.

The fourth insulating portion 24 is provided inside a fourth trench 28. The fourth trench 28 is disposed at a position separated from each of the first trench 25, the second trench 26, and the third trench 27 in a planar direction DR1 and penetrates through the third conductive film 19, the second piezoelectric film 18 and the second conductive film 17 from the upper surface 19a of the third conductive film 19, and does not penetrate through the first piezoelectric film 16. A bottom portion 28a of the fourth trench 28 is positioned on the first piezoelectric film 16. The fourth insulating portion 24 has a higher electrical resistivity than the second piezoelectric film 18. The fourth insulating portion 24 is air existing inside the fourth trench 28.

Figure 5A:
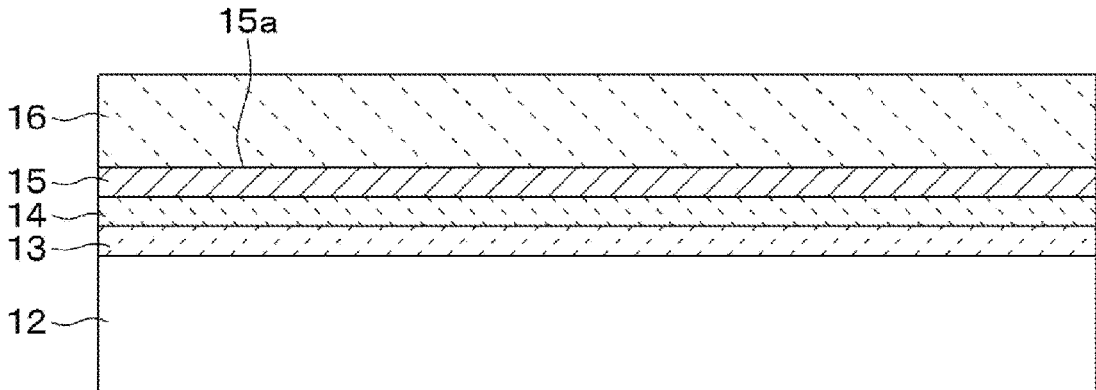
FIG. 5A is a cross-sectional view showing a manufacturing process of the piezoelectric device of the second embodiment.

Next, a method of manufacturing the piezoelectric device 11 of the present embodiment is described. First, as shown in FIG. 5A, a laminated body is formed in which the substrate 12, the insulating film 13, the seed film 14, the first conductive film 15, and the first piezoelectric film 16 are laminated. In forming such a laminated body, the insulating film 13, the seed film 14, and the first conductive film 15 are formed on the substrate 12 in the order described. The space portion 121 is not formed on the substrate 12 at the step of FIG. 5A. After that, the first piezoelectric film 16 is formed on the first conductive film 15 in contact with the upper surface 15a of the first conductive film 15.

Figure 5B:
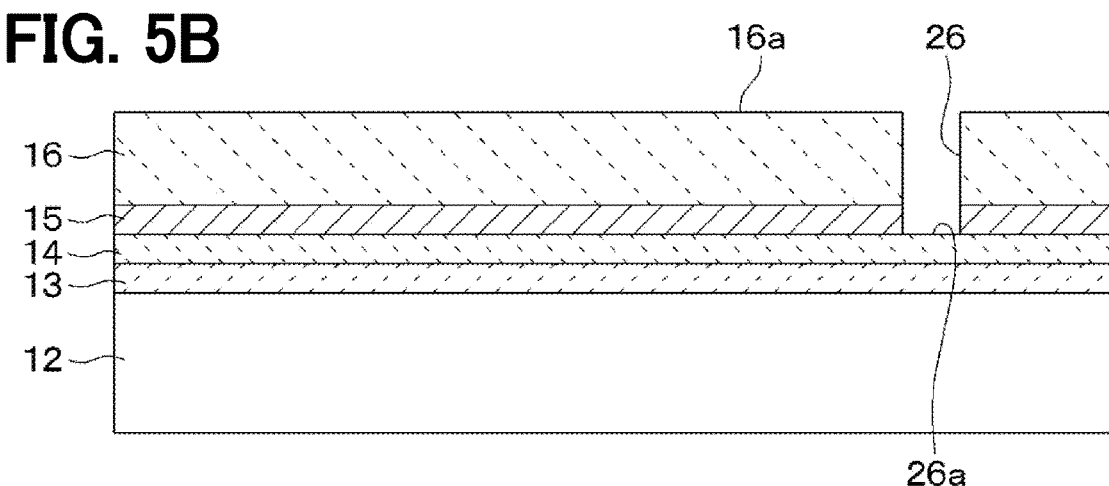
FIG. 5B is a cross-sectional view showing a manufacturing process of the piezoelectric device following FIG. 5A.

Subsequently, as shown in FIG. 5B, the second trench 26 is formed. The second trench 26 penetrates through the first piezoelectric film 16 and the first conductive film 15 from the upper surface 16a of the first piezoelectric film 16. The bottom portion 26a of the second trench 26 is positioned on the seed film 14. The second trench 26 is formed by photolithography and etching. As the etching method, a method of etching in accordance with the material constituting each of the first piezoelectric film 16 and the first conductive film 15 is adopted.

Figure 5C:
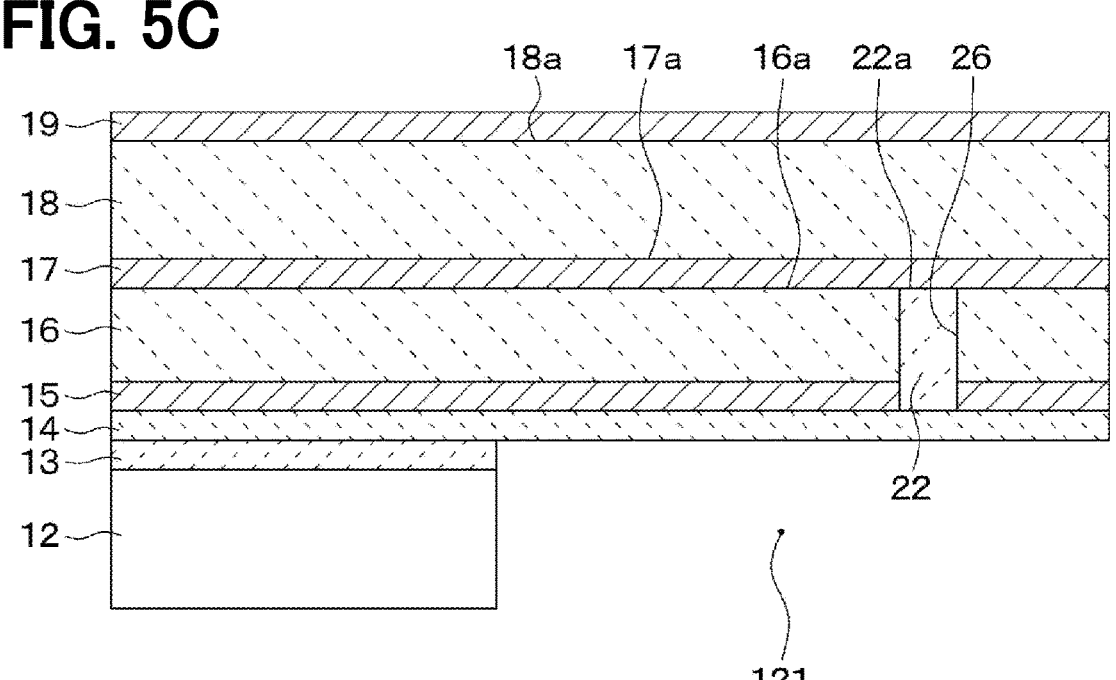
FIG. 5C is a cross-sectional view showing a manufacturing process of the piezoelectric device following FIG. 5B.

Subsequently, as shown in FIG. 5C, the second insulating portion 22 is formed by embedding an insulating material inside the second trench 26. After an upper surface 22a of the second insulating portion 22 is flattened by CMP (Chemical Mechanical Polishing) or the like, the second conductive film 17 is formed to extend over the upper surface 16a of the first piezoelectric film 16 and the upper surface 22a of the second insulating portion 22. After that, the second piezoelectric film 18 is formed on the second conductive film 17 in contact with the upper surface 17a of the second conductive film 17. After that, the third conductive film 19 is formed on the second piezoelectric film 18 in contact with the upper surface 18a of the second piezoelectric film 18. After that, the space portion 121 of the substrate 12 is formed by photolithography and etching of the substrate 12 and the insulating film 13.

Figure 5D:
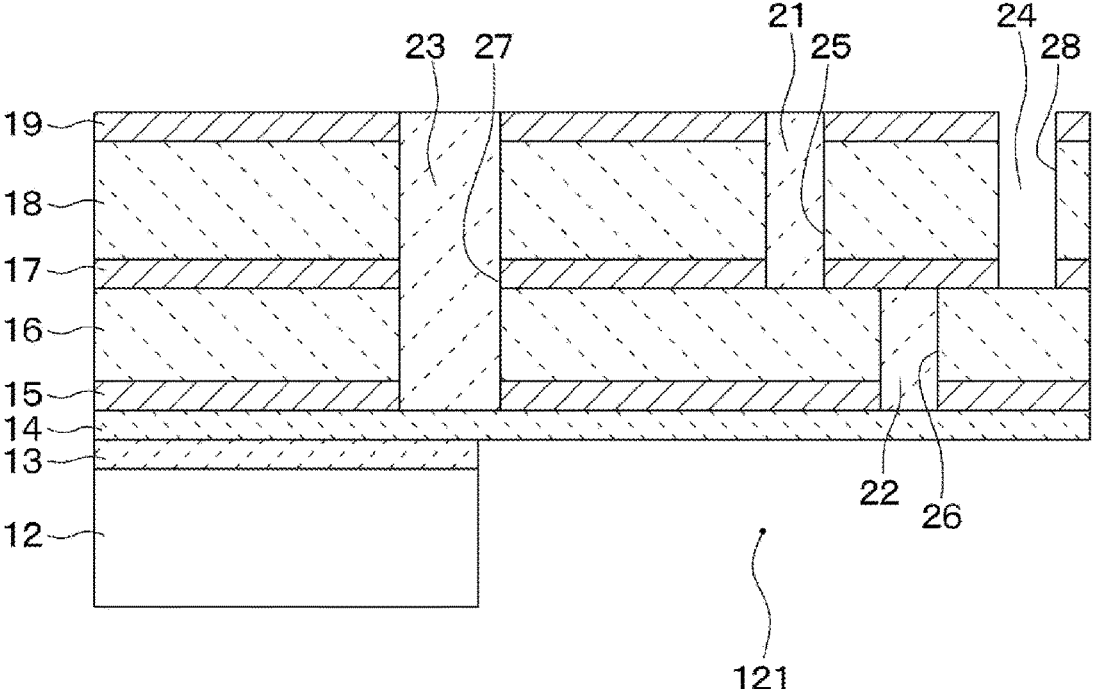
FIG. 5D is a cross-sectional view showing a manufacturing process of the piezoelectric device following FIG. 5C.

Subsequently, as shown in FIG. 5D, the first trench 25 and the fourth trench 28 are formed at positions respectively away from the second trench 26 in the planar direction DR1. The first trench 25 and the fourth trench 28 are separated from each other in the planar direction DR1. The first trench 25 and the fourth trench 28 penetrate, from the upper surface 19a of the third conductive film 19, through the third conductive film 19, the second piezoelectric film 18, and the second conductive film 17. The bottom portions 25a and 28a of the first trench 25 and the fourth trench 28 are positioned on the first piezoelectric film 16. The first trench 25 and the fourth trench 28 are formed by photolithography and etching. As the etching method, a method of etching in accordance with the material constituting each of the third conductive film 19, the second piezoelectric film 18, and the second conductive film 17 is adopted.

Further, in the planar direction DR1, the third trench 27 is formed at a position away from each of the first, second, and fourth trenches 25, 26, and 28. The third trench 27 penetrates, from the upper surface 19a of the third conductive film 19, through the third conductive film 19, the second piezoelectric film 18, the second conductive film 17, the first piezoelectric film 16, and the first conductive film 15. A bottom portion 27a of the third trench 27 is positioned on the seed film 14. The third trench 27 is formed by photolithography and etching. As the etching method, a method of etching in accordance with the material constituting each of the third conductive film 19, the second piezoelectric film 18, the second conductive film 17, the first piezoelectric film 16, and the first conductive film 15 is adopted.

Subsequently, as shown in FIG. 5E, the first insulating portion 21 is formed by embedding an insulating material inside the first trench 25. By embedding an insulating material inside the third trench 27, the third insulating portion 23 is formed. No insulating material is embedded inside the fourth trench 28. The fourth insulating portion 24 is formed by the air inside the fourth trench 28. In such manner, the piezoelectric device 11 of the present embodiment is manufactured.

The timing of forming the space 121 of the substrate 12 may be changeable. The timing for forming the space portion 121 may be, for example, after forming the laminated body and before forming the second trench 26, as shown in FIG. 5A. Further, the timing for forming the space portion 121 may be after the formation of the first to fourth trenches 25 to 28.

In the piezoelectric device 11 of the present embodiment, the floating portion of the laminated structure portion D1 vibrates depending on a sensing target such as a sound pressure. In this case, a tensile stress is applied to one side of the first piezoelectric film 16 and the second piezoelectric film 18, and a compressive stress is applied to the other side of the first piezoelectric film 16 and the second piezoelectric film 18. At this time, the sensing target is detected by extracting electric charges from each of the first piezoelectric film 16 and the second piezoelectric film 18 via the first conductive film 15, the second conductive film 17, and the third conductive film 19, respectively.

In the piezoelectric device 11 of the present embodiment, as shown in FIG. 4, the second conductive film 17 is arranged on the first piezoelectric film 16 in contact with the upper surface 16a of the first piezoelectric film 16 as a base member. The second piezoelectric film 18 is arranged on the second conductive film 17 in contact with the upper surface 17a of the second conductive film 17. The third conductive film 19 is arranged on the second piezoelectric film 18.

Further, the first insulating portion 21 is provided inside the first trench 25 that penetrates through the second piezoelectric film 18 and the second conductive film 17. According to the above, the insulating property can be ensured by the first insulating portion 21 between (i) the second conductive film 17 and the second piezoelectric film 18 on one side with respect to the first insulating portion 21 and (ii) the second conductive film 17 and the second piezoelectric film 18 on the other side with respect to the first insulating portion 21. In the second embodiment shown in FIG. 4, the second conductive film 17 and the second piezoelectric film 18 on one side of the first insulating portion 21 correspond to the first conductive film 5 and the piezoelectric film 6 on one side of the insulating portion 8 of the first embodiment.

The second conductive film 17 and the second piezoelectric film 18 on the other side of the first insulating portion 21 correspond to the first conductive film 5 and the piezoelectric film 6 on the other side of the insulating portion 8 of the first embodiment. The third conductive film 19 of the second embodiment corresponds to the second conductive film 7 of the first embodiment. For the above-mentioned reasons, the same effects as those of the first embodiment is obtainable in the second embodiment.

Further, the fourth insulating portion 24 is provided inside the fourth trench 28 penetrating the second piezoelectric film 18 and the second conductive film 17. According to the above, the insulating property between (i) the second conductive film 17 and the second piezoelectric film 18 on one side of the fourth insulating portion 24 and (ii) the second conductive film 17 and the second piezoelectric film 18 on the other side of the fourth insulating portion 24 is ensured by the fourth insulating portion 24. The second conductive film 17 and the second piezoelectric film 18 on one side of the fourth insulating portion 24 correspond to the first conductive film 5 and the piezoelectric film 6 on one side of the insulating portion 8 of the first embodiment. The second conductive film 17 and the second piezoelectric film 18 on the other side of the fourth insulating portion 24 correspond to the first conductive film 5 and the piezoelectric film 6 on the other side of the insulating portion 8 of the first embodiment. For the above-mentioned reasons, the same effects as those of the first embodiment is obtainable.

Further, the third insulating portion 23 is provided inside the third trench 27 penetrating the second piezoelectric film 18 and the second conductive film 17. According to the above, the insulating property between (i) the second conductive film 17 and the second piezoelectric film 18 on one side of the third insulating portion 23, and (ii) the second conductive film 17 and the second piezoelectric film 18 on the other side of the third insulating portion 23 is ensured by the third insulating portion 23. The second conductive film 17 and the second piezoelectric film 18 on one side of the third insulating portion 23 correspond to the first conductive film 5 and the piezoelectric film 6 on one side of the insulating portion 8 of the first embodiment. The second conductive film 17 and the second piezoelectric film 18 on the other side of the third insulating portion 23 correspond to the first conductive film 5 and the piezoelectric film 6 on the other side of the insulating portion 8 of the first embodiment. For the above-mentioned reasons, the same effects as those of the first embodiment is obtainable.

Further, the first conductive film 15 is arranged on the seed film 14 in contact with the upper surface 14a of the seed film 14 as a base member. The first piezoelectric film 16 is in contact with an upper surface 15a of the first conductive film 15 and is arranged on the first conductive film 15. The second conductive film 17 is arranged on the first piezoelectric film 16.

Further, the second insulating portion 22 is provided inside the second trench 26 that penetrates through the first piezoelectric film 16 and the first conductive film 15. According to the above, the insulating property between (i) the first conductive film 15 and the first piezoelectric film 16 on one side of the second insulating portion 22 and (ii) the first conductive film 15 and the first piezoelectric film 16 on the other side of the second insulating portion 22 is ensured by the second insulating portion 22. The first conductive film 15 and the first piezoelectric film 16 on one side of the second insulating portion 22 correspond to the first conductive film 5 and the piezoelectric film 6 on one side of the insulating portion 8 of the first embodiment. The first conductive film 15 and the first piezoelectric film 16 on the other side of the second insulating portion 22 correspond to the first conductive film 5 and the piezoelectric film 6 on the other side of the insulating portion 8 of the first embodiment. For the above-mentioned reasons, the same effects as those of the first embodiment is obtainable.

Further, the third insulating portion 23 is provided inside the third trench 27 penetrating the first piezoelectric film 16 and the first conductive film 15. According to the above, the insulating property between (i) the first conductive film 15 and the first piezoelectric film 16 on one side of the third insulating portion 23, and (ii) the first conductive film 15 and the first piezoelectric film 16 on the other side of the third insulating portion 23 is ensured by the third insulating portion 23. The first conductive film 15 and the first piezoelectric film 16 on one side of the third insulating portion 23 correspond to the first conductive film 5 and the piezoelectric film 6 on one side of the insulating portion 8 of the first embodiment. The first conductive film 15 and the first piezoelectric film 16 on the other side of the third insulating portion 23 correspond to the first conductive film 5 and the piezoelectric film 6 on the other side of the insulating portion 8 of the first embodiment. For the above-mentioned reasons, the same effects as those of the first embodiment is obtainable.

Further, according to the piezoelectric device 11 of the present embodiment, the following effects are obtainable. Highly sensitive sensors are used to detect small changes. Therefore, in a piezoelectric device applied to a high-sensitivity sensor, even a slight crack in the piezoelectric film leads to a fatal deterioration of the sensor characteristics. Generally, in the manufacture of a bimorph type piezoelectric device in which a first piezoelectric film and a second piezoelectric film are stacked, when the second piezoelectric film which is the upper layer is formed, uniformity of a surface on which the second piezoelectric film is formed is lost, i.e., is less desirable, than uniformity of a surface on which the first piezoelectric film, which is the lower layer, is formed. Therefore, the second piezoelectric film is more likely to have cracks than the first piezoelectric film. Therefore, in order to apply the bimorph type piezoelectric device to a highly sensitive sensor, it is particularly necessary to suppress cracks in the second piezoelectric film.

The piezoelectric device 11 of the present embodiment is provided with first, third, and fourth insulating portions 21, 23, and 24 at the second piezoelectric film 18. When the second piezoelectric film 18 is formed at positions of each of the first, third, and fourth insulating portions 21, 23, and 24, cracks may likely to occur in the second piezoelectric film 18 at those positions. According to the piezoelectric device 11 of the present embodiment, the first, third, and fourth insulating portions 21, 23, and 24 are arranged in the portions where cracks are likely to occur. Therefore, it is possible to suppress the occurrence of cracks in the second piezoelectric film 18. As a result, the leak current that could otherwise occur in the portion of the second piezoelectric film 18 positioned between the two second conductive films 17 can be restricted even when the second piezoelectric film 18 is arranged at a position between the two second conductive films 17.

Further, according to the piezoelectric device 11 of the present embodiment, the third insulating portion 23 is positioned inside the third trench 27 penetrating the first piezoelectric film 16 and the second piezoelectric film 18. According to the above, compared with a situation different from the present embodiment, in which the trench penetrating the first piezoelectric film 16 and the trench penetrating the second piezoelectric film 18 are separately formed in the formation of the third insulating portion 23, the number of manufacturing processes is reducible. Further, in the present embodiment, it can prevent a position shift of the two trenches caused in a situation in which the trench penetrating the first piezoelectric film 16 and the trench penetrating the second piezoelectric film 18 are separately formed in the formation of the third insulating portion 23.

Further, according to the piezoelectric device 11 of the present embodiment, the first insulating portion 21 and the second insulating portion 22 are arranged at different positions in the planar direction DR1. In the sensing portion positioned above the space portion 121 of the laminated structure portion D1, the arrangement position of the first conductive film 15 and the arrangement position of the second conductive film 17 may be different from each other in the planar direction DR1 in order to secure the strength. By arranging the first insulating portion 21 and the second insulating portion 22 at different positions in the planar direction DR1, it is possible to easily set a situation in which the arrange position of the first conductive film 15 and the arrangement position of the second conductive film 17 are made different in the planar direction DR1.

Although the piezoelectric device 11 of the present embodiment includes both the first insulating portion 21 and the second insulating portion 22, only the first insulating portion 21 in the first insulating portion 21 and the second insulating portion 22 may be provided. Even in such case, by providing the first insulating portion 21, it is possible to suppress the occurrence of cracks in the second piezoelectric film 18.

Further, in the method for manufacturing the piezoelectric device 11 of the present embodiment, the first trench 25 and the third trench 27 are formed after the third conductive film 19 is formed. However, after forming the first trench 25 and the third trench 27, the first insulating portion 21 and the third insulating portion 23 are formed. After that, the third conductive film 19 may be formed and the third conductive film 19 may be patterned.

Third Embodiment

Figure 6:
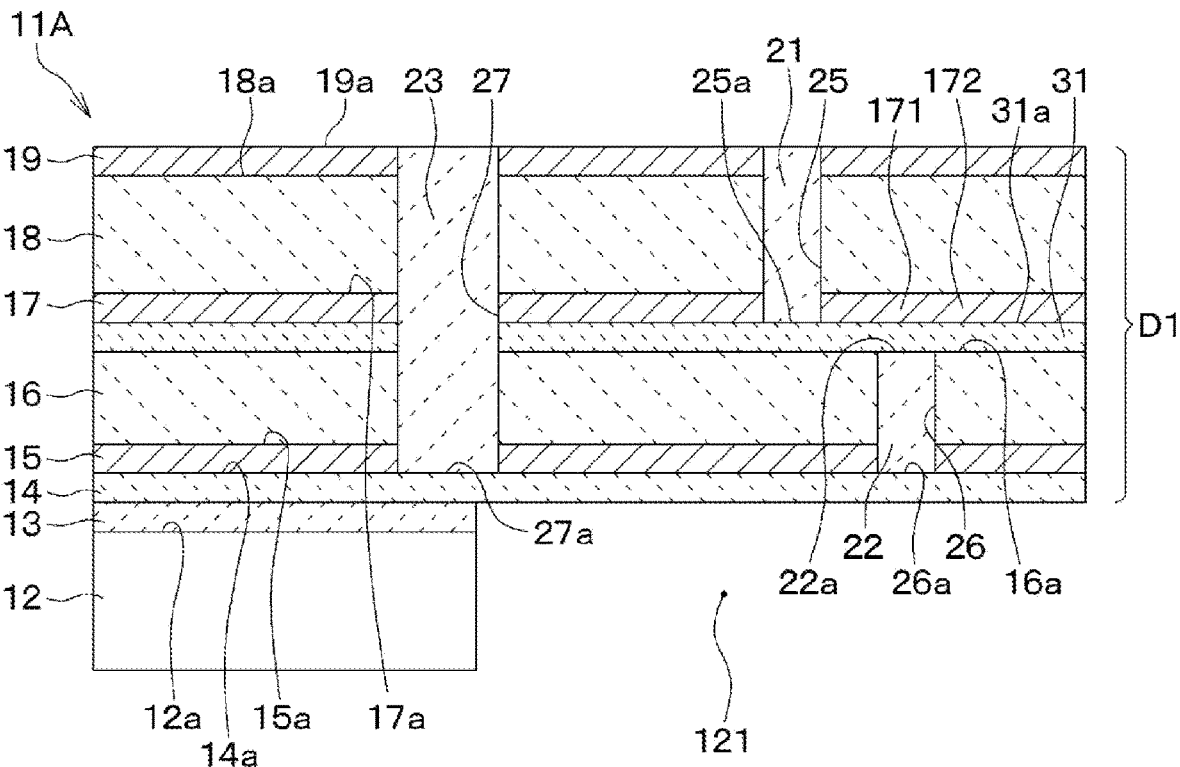
FIG. 6 is a cross-sectional view of a piezoelectric device of a third embodiment.

As shown in FIG. 6, a piezoelectric device 11A of the present embodiment includes an insulating amorphous film 31. The amorphous film 31 is continuously arranged at a position above both of the second insulating portion 22 and the first piezoelectric film 16. The amorphous film 31 is directly in contact with the upper surface 22a of the second insulating portion 22 and the upper surface 16a of the first piezoelectric film 16. The amorphous film 31 is made of the same material as the second insulating portion 22 (for example, SiO2). The second conductive film 17 is in contact with an upper surface 31a of the amorphous film 31 and is continuously extending and is arranged at a position above both of the second insulating portion 22 and the first piezoelectric film 16. The bottom portion 25a of the first trench 25 is positioned on the amorphous film 31. Other configurations of the piezoelectric device 11A are the same as those of the piezoelectric device 11 of the second embodiment.

When the second conductive film 17 is formed in contact with both of the upper surface 22a of the second insulating portion 22 and the upper surface 16a of the first piezoelectric film 16 as in the piezoelectric device 11 of the second embodiment, there is a difference in crystallinity between the portion of the second conductive film 17 positioned directly above the second insulating portion 22 and the portion of the second conductive film 17 positioned directly above the first piezoelectric film 16.

In contrast, according to the piezoelectric device 11A of the present embodiment, in the production of the piezoelectric device 11A, the second conductive film 17 is continuously formed at the position above both of the second insulating portion 22 and the first piezoelectric film 16, directly in contact with the upper surface 31*a* of the amorphous film 31. Therefore, the difference in crystallinity between a portion 171 of the second conductive film 17 positioned directly above the second insulating portion 22 and a portion 172 of the second conductive film 17 positioned directly above the first piezoelectric film 16 is reducible. As a result, the crystallinity of the second piezoelectric film 18 formed in contact with the upper surface 17*a* of the second conductive film 17 is brought closer to uniform.

Further, according to the piezoelectric device 11A of the present embodiment, the amorphous film 31 is made of the same material as the second insulating portion 22. Thereby, in the production of the piezoelectric device 11A, the formation of the second insulating portion 22 and the formation of the amorphous film 31 are continuously performable. That is, both of the second insulating portion 22 and the amorphous film 31 can be formed in one step.

The amorphous film 31 may be made of a material different from that of the second insulating portion 22. In such case, for example, the second insulating portion 22 is made of SiO2. The amorphous film 31 is made of SiN. Further, another film may be arranged between (i) each of the second insulating portion 22 and the first piezoelectric film 16 and (ii) the amorphous film 31.

Fourth Embodiment

Figure 7:
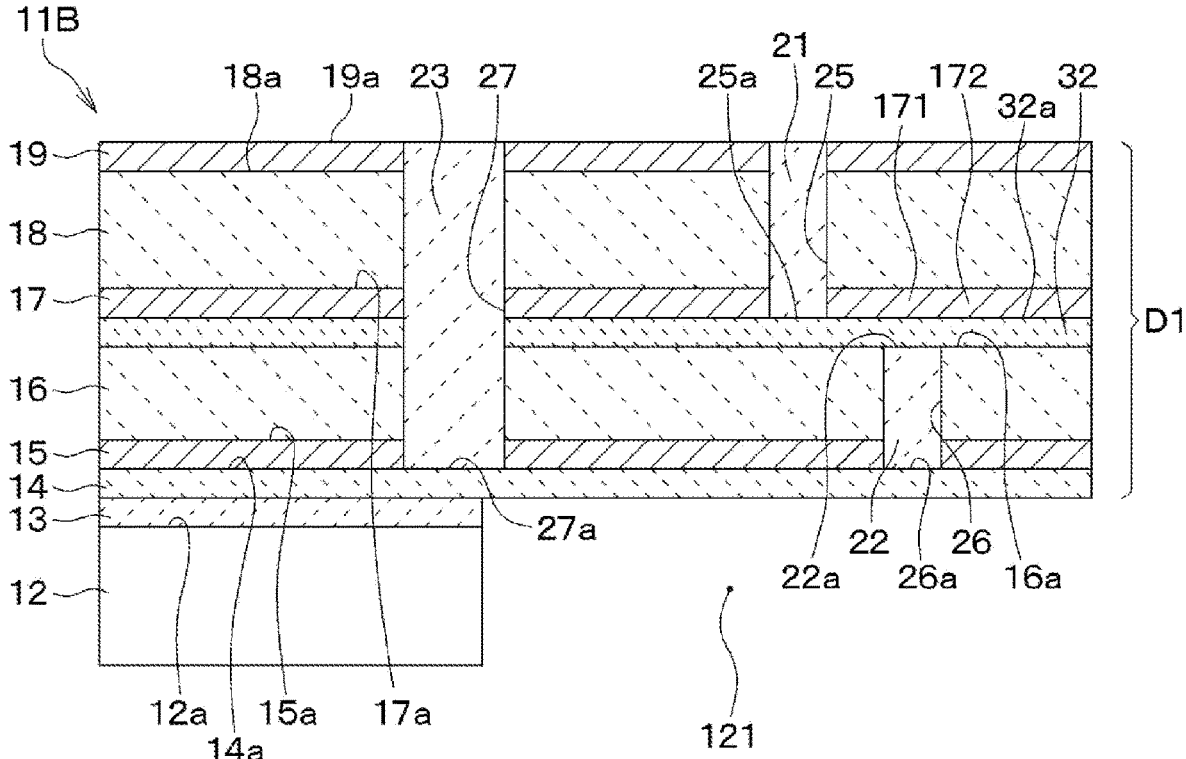
FIG. 7 is a cross-sectional view of a piezoelectric device of a fourth embodiment.

As shown in FIG. 7, a piezoelectric device 11B of the present embodiment includes a second seed film 32. The second seed film 32 is continuously arranged at a position directly above both of the second insulating portion 22 and the first piezoelectric film 16. The second seed film 32 is in contact with the upper surface 22*a* of the second insulating portion 22 and the upper surface 16*a* of the first piezoelectric film 16. The seed film 14 described in the second embodiment is used as a first seed film 14 in the present embodiment. The second seed film 32 is made of the same material as the first seed film 14. In the present embodiment, the piezoelectric material constituting the first piezoelectric film 16 and the second piezoelectric film 18 is ScAlN. The material constituting the first seed film 14 and the second seed film 32 is AlN.

The second conductive film 17 is in contact with an upper surface 32*a* of the second seed film 32 and is continuously arranged at a position directly above both of the second insulating portion 22 and the first piezoelectric film 16. Other configurations of the piezoelectric device 11B are the same as those of the piezoelectric device 11 of the second embodiment. According to the piezoelectric device 11B of the present embodiment, the same effects as those of the third embodiment are obtainable.

Further, in the piezoelectric device 11B of the present embodiment, the insulating material constituting the first, second, and third insulating portions 21, 22, and 23 is the same material as the material constituting the first seed film 14. According to the above, in the production of the piezoelectric device 11B, the formation of the first seed film 14, the formation of the second insulating portion 22, and the formation of the second seed film 32 are continuously performable.

Note that the insulating material constituting the second insulating portion 22 may be the same as the material constituting the first seed film 14, and the insulating material constituting the first and third insulating portions 21 and 23 may be different from the material constituting the first seed film 14. Further, the insulating material constituting the first, second and third insulating portions 21, 22 and 23 may be different from the material constituting the first seed film 14. Further, another film may be arranged between (i) each of the second insulating portion 22 and the first piezoelectric film 16 and (ii) the second seed film 32.

Fifth Embodiment

Figure 8:
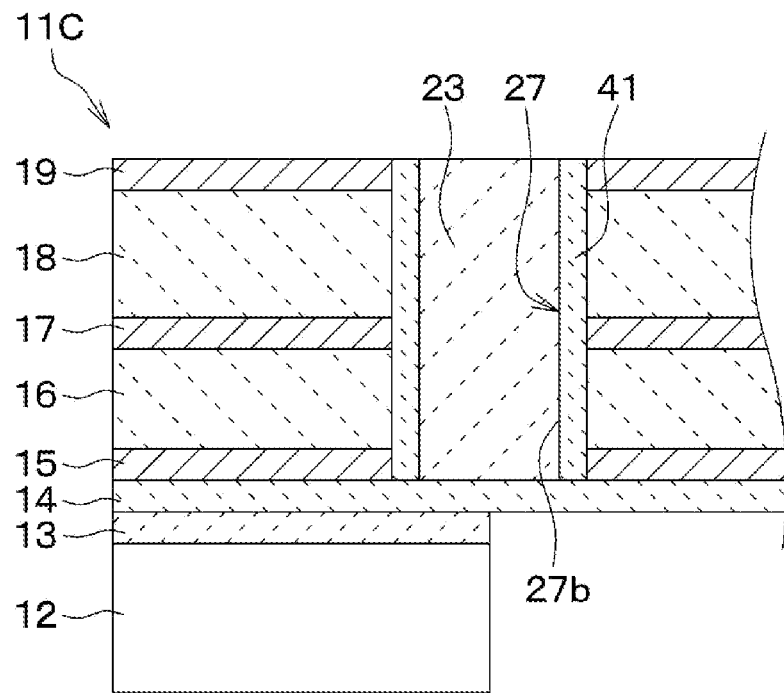
FIG. 8 is a cross-sectional view of a piezoelectric device of a fifth embodiment.

As shown in FIG. 8, a piezoelectric device 11C of the present embodiment includes an oxide layer 41 provided on a side wall portion 27*b* of the third trench 27. That is, the oxide layer 41 constitutes the side wall portion 27*b* of the third trench 27. The oxide layer 41 is in contact with the third insulating portion 23. Further, the oxide layer 41 is in contact with each of the first conductive film 15, the first piezoelectric film 16, the second conductive film 17, the second piezoelectric film 18, and the third conductive film 19. The oxide layer 41 contains the same elements as the elements constituting each of the first conductive film 15, the first piezoelectric film 16, the second conductive film 17, the second piezoelectric film 18, and the third conductive film 19.

Figure 9A:
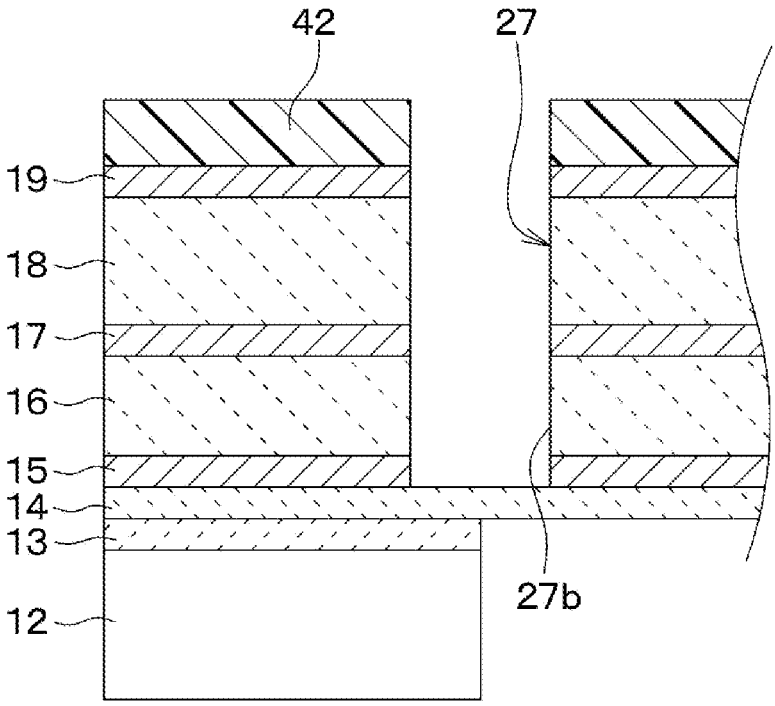
FIG. 9A is a cross-sectional view showing a manufacturing process of the piezoelectric device of the fifth embodiment.

The method for forming the oxide layer 41 and the third insulating portion 23 is as follows. As shown in FIG. 9A, the third trench 27 is formed as in the second embodiment. At this time, etching is performed using a resist pattern 42 formed by photolithography as a mask. At this stage, the side wall portion 27*b* of the third trench 27 is made by the first conductive film 15, the first piezoelectric film 16, the second conductive film 17, the second piezoelectric film 18, and the third conductive film 19.

Figure 9B:
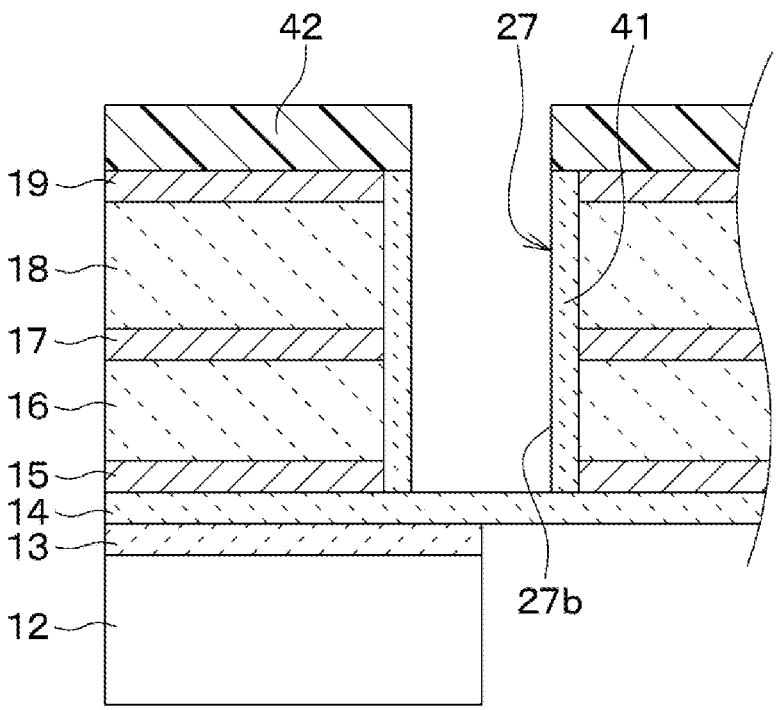
FIG. 9B is a cross-sectional view showing a manufacturing process of the piezoelectric device following FIG. 9A.

Then, as shown in FIG. 9B, the side wall of the third trench 27 is subjected to an oxidation treatment. The oxidation treatment is, for example, a heat treatment in a state where oxygen is present inside the third trench 27. As a result, the oxide layer 41 is formed on the side wall portion 27*b*. That is, the side wall portion 27*b* is made of the oxide layer 41. After that, the insulating material is embedded in the third trench 27 to form the third insulating portion 23 shown in FIG. 8.

Other configurations of the piezoelectric device 11C are the same as those of the piezoelectric device 11 of the second embodiment. Therefore, the same effects as that of the second embodiment are obtainable. Further, according to the piezoelectric device 11C of the present embodiment, the following effects are obtainable.

According to the piezoelectric device 11C of the present embodiment, since the oxide layer 41 is provided on the side wall portion 27*b*, the effects of improving the electrical insulating property of the side wall portion 27*b* are obtainable. Further, since the third insulating portion 23 is in contact with the oxide layer 41, the effects of improving the adhesion between the third insulating portion 23 and the side wall portion 27*b* are obtainable.

Note that the oxide layer 41 is not limited to the third trench 27, and may also be provided on the side wall portions of the first trench 25 and the second trench 26.

Other Embodiments

The present disclosure is not limited to the above-described embodiments, and can be appropriately modified within the scope of the claims, and includes various modifications and modifications within the range of equivalents. The embodiments described above are not independent of each other, and can be appropriately combined except when the combination is obviously impossible. Individual elements or features of a particular embodiment are not necessarily essential unless it is specifically stated that the elements or the features are essential in the foregoing description, or unless the elements or the features are obviously essential in principle. In each of the above embodiments, when the material, shape, positional relationship, and the like of the constituent elements and the like are referred to, the material, the shape, the positional relationship, and the like are not limited unless otherwise specified or limited to specific materials, shapes, positional relationships, and the like in principle.

What is claimed is:

1. A piezoelectric device comprising:
a base member;
a first conductive film arranged on the base member in contact with an upper surface of the base member, and made of a conductive material;
a piezoelectric film arranged on the first conductive film in contact with an upper surface of the first conductive film and made of a piezoelectric material;
a second conductive film arranged on the piezoelectric film and made of a conductive material; and
an insulating portion provided inside a trench that penetrates through the piezoelectric film and the first conductive film, and having an electrical resistivity higher than that of the piezoelectric film.

2. The piezoelectric device of claim 1, wherein
the insulating portion is made of a material embedded inside the trench.

3. The piezoelectric device of claim 1, wherein
the insulating portion is made of air existing inside the trench.

4. The piezoelectric device of claim 1, wherein
the piezoelectric device includes an oxide layer provided on a side wall of the trench.

5. The piezoelectric device of claim 1, wherein
the piezoelectric material is ScAln.

6. The piezoelectric device of claim 1, wherein
the trench penetrates through the second conductive film, the piezoelectric film and the first conductive film.

7. A piezoelectric device comprising:
a base member;
a first conductive film arranged on the base member in contact with an upper surface of the base member, and made of a conductive material;
a first piezoelectric film arranged on the first conductive film in contact with an upper surface of the first conductive film, and made of a piezoelectric material;
a second conductive film arranged on the first piezoelectric film and made of a conductive material;
a second piezoelectric film arranged on the second conductive film in contact with an upper surface of the second conductive film, and made of a piezoelectric material;
a third conductive film arranged on the second piezoelectric film and made of a conductive material; and
an insulating portion provided inside a trench that penetrates through at least the second piezoelectric film and the second conductive film, and having an electrical resistivity higher than that of the second piezoelectric film.

8. The piezoelectric device of claim 7, wherein
the trench penetrates through all the second piezoelectric film, the second conductive film, the first piezoelectric film, and the first conductive film.

9. The piezoelectric device of claim 7, wherein
the insulating portion is a first insulating portion disposed in a first trench as the trench that penetrates through the second piezoelectric film and the second conductive film without penetrating through the first piezoelectric film,
the piezoelectric device further comprising
a second insulating portion disposed inside a second trench at a position away from the first trench in a planar direction along an upper surface of the first piezoelectric film, wherein
the second trench penetrates through the first piezoelectric film and the first conductive film, without penetrating through the second conductive film.

10. The piezoelectric device of claim 7, wherein
the insulating portion is a first insulating portion disposed in a first trench as the trench that penetrates through the second piezoelectric film and the second conductive film without penetrating through the first piezoelectric film, and
the piezoelectric device further comprising:
a second insulating portion disposed inside a second trench at a position away from the first trench in a planar direction along an upper surface of the first piezoelectric film, the second trench penetrating through the first piezoelectric film and the first conductive film without penetrating through the second conductive film; and
a third insulating portion disposed inside a third trench at a position away from each of the first trench and the second trench in a planar direction along the upper surface of the first piezoelectric film, the third trench penetrating through all the second piezoelectric film, the second conductive film, the first piezoelectric film and the first conductive film.

11. The piezoelectric device of claim 9, further comprising:
an insulating amorphous film continuously arranged at a position directly above both of the second insulating portion and the first piezoelectric film, wherein
the second conductive film is continuously arranged in contact with an upper surface of the amorphous film at a position above both of the second insulating portion and the first piezoelectric film.

12. The piezoelectric device of claim 11, wherein
the second insulating portion and the amorphous film are made of a same insulating material.

13. The piezoelectric device of claim 9, wherein
the base member is a first seed film configured to improve a crystallinity of the first conductive film and the first piezoelectric film,
the piezoelectric device further comprising
a second seed film continuously arranged at a position directly above both of the second insulating portion and the first piezoelectric film, and made of a same material as the first seed film, and
the second conductive film is arranged in contact with an upper surface of the second seed film, and is continuously arranged at a position above both of the second insulating portion and the first piezoelectric film.

14. The piezoelectric device of claim 13, wherein the second insulating portion is made of a material that is same as the first seed film.

\* \* \* \* \*